United States Patent
Wu et al.

(10) Patent No.: US 10,847,530 B2
(45) Date of Patent: Nov. 24, 2020

(54) NITRIDE-FREE SPACER OR OXIDE SPACER FOR EMBEDDED FLASH MEMORY

(71) Applicant: Taiwan Semiconductor Manufacturing Co., Ltd., Hsin-Chu (TW)

(72) Inventors: Wei Cheng Wu, Zhubei (TW); Jui-Tsung Lien, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/587,246

(22) Filed: Sep. 30, 2019

(65) Prior Publication Data
US 2020/0035692 A1    Jan. 30, 2020

Related U.S. Application Data

(60) Continuation of application No. 16/396,963, filed on Apr. 29, 2019, now Pat. No. 10,475,805, which is a
(Continued)

(51) Int. Cl.
*H01L 27/1157* (2017.01)
*H01L 21/28* (2006.01)
(Continued)

(52) U.S. Cl.
CPC .... *H01L 27/1157* (2013.01); *H01L 27/11568* (2013.01); *H01L 29/40117* (2019.08);
(Continued)

(58) Field of Classification Search
CPC .................................................. H01L 27/1157
(Continued)

(56) References Cited

U.S. PATENT DOCUMENTS

| | | |
|---|---|---|
| 7,888,211 B2 | 2/2011 | Shim |
| 9,440,170 B2 | 9/2016 | Quintel |

(Continued)

FOREIGN PATENT DOCUMENTS

| | | |
|---|---|---|
| JP | 2013058810 A | 3/2013 |
| WO | 2008083134 A1 | 7/2008 |

OTHER PUBLICATIONS

Non-Final Office Action dated May 19, 2017 for U.S. Appl. No. 14/933,046.
(Continued)

*Primary Examiner* — Ajay Arora
(74) *Attorney, Agent, or Firm* — Eschweiler & Potashnik, LLC (57) ABSTRACT

In some embodiments, a semiconductor substrate includes first and second source/drain regions which are separated from one another by a channel region. The channel region includes a first portion adjacent to the first source/drain region and a second portion adjacent the second source/drain region. A select gate is spaced over the first portion of the channel region and is separated from the first portion of the channel region by a select gate dielectric. A memory gate is spaced over the second portion of the channel region and is separated from the second portion of the channel region by a charge-trapping dielectric structure. The charge-trapping dielectric structure extends upwardly alongside the memory gate to separate neighboring sidewalls of the select gate and memory gate from one another. An oxide spacer or nitride-free spacer is arranged in a sidewall recess of the charge-trapping dielectric structure nearest the second source/drain region.

20 Claims, 8 Drawing Sheets

Related U.S. Application Data continuation of application No. 15/938,043, filed on Mar. 28, 2018, now Pat. No. 10,347,649, which is a division of application No. 14/933,046, filed on Nov. 5, 2015, now Pat. No. 9,960,176.

(51) Int. Cl.
  *H01L 27/11568* (2017.01)
  *H01L 29/423* (2006.01)
  *H01L 29/66* (2006.01)
  *H01L 29/792* (2006.01)

(52) U.S. Cl.
  CPC .. *H01L 29/42344* (2013.01); *H01L 29/66833* (2013.01); *H01L 29/792* (2013.01)

(58) Field of Classification Search
  USPC .......................................................... 257/324
  See application file for complete search history.

(56) References Cited

U.S. PATENT DOCUMENTS

| | | |
|---|---|---|
| 2007/0278564 A1 | 12/2007 | Ishii et al. |
| 2008/0067572 A1 | 3/2008 | Mokhlesi |
| 2008/0227254 A1 | 9/2008 | Rao et al. |
| 2009/0039410 A1 | 2/2009 | Liu et al. |
| 2009/0242964 A1 | 10/2009 | Akil et al. |
| 2010/0255670 A1 | 10/2010 | Onda |
| 2012/0252171 A1 | 10/2012 | Shroff et al. |
| 2012/0299084 A1 | 11/2012 | Saito et al. |
| 2014/0210012 A1 | 7/2014 | Fang et al. |
| 2014/0239367 A1 | 8/2014 | Saito et al. |
| 2015/0008509 A1* | 1/2015 | Charpin-Nicolle .......................... H01L 29/42344 257/326 |
| 2015/0048439 A1* | 2/2015 | Shum .................. H01L 29/7816 257/326 |
| 2015/0102430 A1 | 4/2015 | Hui et al. |
| 2015/0236030 A1 | 8/2015 | Wu et al. |

OTHER PUBLICATIONS

Notice of Allowance dated Dec. 20, 2017 for U.S. Appl. No. 14/933,046.
Non-Final Office Action dated Nov. 20, 2018 for U.S. Appl. No. 15/938,043.
Notice of Allowance dated Apr. 10, 2019 for U.S. Appl. No. 15/938,043.
Notice of Allowance dated Jul. 3, 2019 for U.S. Appl. No. 16/396,963.

\* cited by examiner

NITRIDE-FREE SPACER OR OXIDE SPACER FOR EMBEDDED FLASH MEMORY

REFERENCE TO RELATED APPLICATIONS

This Application is a Continuation of U.S. application Ser. No. 16/396,963, filed on Apr. 29, 2019, which is a Continuation of U.S. application Ser. No. 15/938,043, filed on Mar. 28, 2018 (now U.S. Pat. No. 10,347,649, issued on Jul. 9, 2019), which is a Divisional of U.S. application Ser. No. 14/933,046, filed on Nov. 5, 2015 (now U.S. Pat. No. 9,960,176, issued on May 1, 2018). The contents of the above-referenced Patent Applications are hereby incorporated by reference in their entirety.

BACKGROUND

Flash memory is an electronic non-volatile computer storage medium that can be electrically erased and reprogrammed quickly. It is used in a wide variety of electronic devices and equipment. Common types of flash memory cells include stacked gate memory cells and split gate memory cells. Compared to stacked gate memory cells, split gate memory cells have higher injection efficiency, less susceptibility to short channel effects, and better over erase immunity.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Modern integrated circuits (ICs) often include logic devices and embedded memory disposed on a single substrate or die. One type of embedded memory included in such ICs is split gate flash memory. A split gate memory cell includes a source region and a drain region which are disposed within a semiconductor substrate and which are separated from one another by a channel region. A select gate (SG) is disposed over a first portion of the channel region nearest the drain, and is separated from the channel region by a SG dielectric. A memory gate (MG) is disposed adjacent to a sidewall of the SG and over a second portion of the channel region nearest the source, and is separated from the channel region by a charge-trapping dielectric layer. A nitride spacer, which can be formed as an aside during formation of logic devices on the die, can be disposed along a sidewall of the charge-trapping dielectric layer and over the channel region nearest the source.

During operation, the SG can be activated to enable current flow through the channel region (e.g., cause a stream of negatively charged electrons to flow between the source and drain regions). While the SG is activated, a large positive voltage can be applied to the MG, thereby attracting electrons from the channel region towards the MG. Some of these electrons become lodged in the charge-trapping layer, thereby changing the threshold voltage (Vt) of the memory cell. The resultant Vt corresponds to the data state stored in the cell. For example, if more than a predetermined amount of charge is lodged on the charge-trapping layer (e.g., magnitude of Vt is greater than some predetermined Vt), then the cell is said to store a first data state (e.g., a logical "0"); whereas if less than the predetermined amount of charge is lodged on the charge-trapping layer (e.g., magnitude of Vt is less than the predetermined Vt), then the cell is said to store a second data state (e.g., a logical "1"). By applying suitable bias conditions to the cell, electrons can be placed on (or stripped from) the charge-trapping layer to set corresponding data states for the cell. In this way, data can be written to and read from the memory cells.

Unfortunately, the nitride spacer disposed alongside the charge-trapping dielectric and disposed over the channel region can cause charge storage and removal anomalies. These anomalies tend to rear their head more as the cell undergoes more read and write operations. For example, due to the presence of the nitride spacer over the channel region, the nitride spacer can tend to undesirably trap charge and shift the Vt of the cell from expected values, particularly as the cell ages and has more read and write operations performed thereon.

The present disclosure relates to a split gate flash memory cell where a nitride-free spacer or an oxide spacer, either of which is relatively impervious to charge-trapping, is inserted in a sidewall recess of the charge-trapping layer nearest the source. Thus, this inserted spacer can extend along the sidewall recess of the charge-trapping layer directly over an outer edge portion of the channel region, and can extend upwards along the MG sidewall (or along a MG spacer sidewall), thereby limiting undesired charge-trapping. In some embodiments, if a nitride spacer is still present for the split gate flash memory, the inserted spacer effectively "pushes" the nitride sidewall spacer outwards so the nitride spacer no longer resides over the channel region. In this way, the nitride-free spacer or oxide spacer limits undesirably trapped charge and provides a flash memory cell with good performance over a long period of time.

Figure 1:
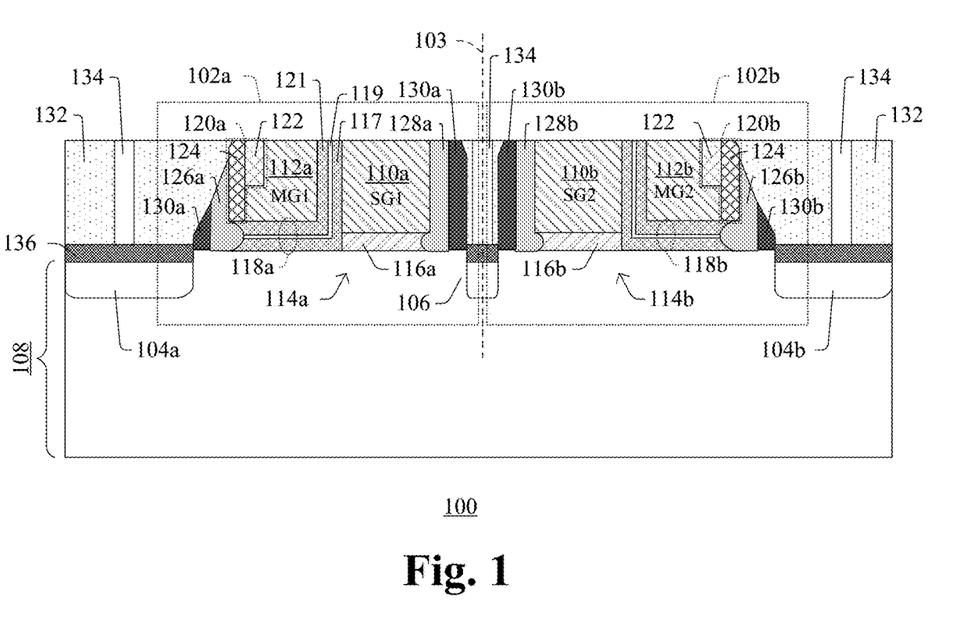
FIG. 1 illustrates a cross-sectional view of a pair of split gate flash memory cells according to some embodiments of the present disclosure.

FIG. 1 illustrates a cross-sectional view of some embodiments of an integrated circuit 100 comprising a pair of split gate memory cells disposed on a semiconductor substrate 108. The pair of split gate memory cell includes first and second memory cells 102a, 102b, which are configured to store separate data states and which are generally mirror images of one another about an axis of symmetry 103. Typically, integrated circuit 100 includes hundreds, thousands, millions, billions, etc., of such memory cells, but only a single pair is illustrated for simplicity and clarity of understanding.

The first and second memory cells 102a, 102b include first and second individual source regions 104a, 104b, respectively, and a common drain region 106 which is shared between the first and second memory cells. It will be appreciated that although region 106 is described as a "common drain region" and regions 104a, 104b are described as being "individual source regions", the functionality of these regions may be flipped during some modes of operation and/or in some other implementations, such that "the common drain 106" may act as a common source region and the "individual source regions 104a, 104b" may act as individual drain regions. Thus, the terms "source" and "drain" are interchangeable in this regard, and may be referred to generically as "source/drain" regions.

The first and second memory cells 102a, 102b also include first and second select gates 110a, 110b, respectively, and first and second memory gates 112a, 112b, respectively. The first select gate 110a and first memory gate 112a are arranged over a first channel region 114a, which separates the first individual source region 104a and the common drain region 106. The second select gate 110b and second memory gate 112b are arranged over a second channel region 114b, which separates the second individual source region 104b and the common drain region 106.

Select gate dielectric 116a, 116b, such as silicon dioxide or a high-κ dielectric material, is arranged under the first and second select gates 110a, 110b, and separates the first and second select gates from the semiconductor substrate 108. Charge-trapping dielectric structure 118a, 118b separates the first and second memory gates 112a, 112b from the semiconductor substrate 108. Thus, the first and second memory gates 112a, 112b are disposed on a ledge corresponding to upper surface of charge-trapping dielectric structure 118a, 118b. The charge-trapping dielectric structure 118a, 118b can also extend vertically upwards between neighboring sidewalls of the first select gate 110a and first memory gate 112a, and between neighboring sidewalls of the second select gate 110b and second memory gate 112b to provide isolation there between.

In some embodiments, the charge-trapping dielectric structure 118a, 118b comprises a charge-trapping layer 119 (e.g. a nitride layer or a layer of randomly arranged sphere-like silicon dots) sandwiched between two dielectric layers 117, 121 (e.g., oxide layers). During operation of the first and second memory cells 102a, 102b, the dielectric layers 117, 121 are structured to promote electron tunneling to and from the charge-trapping layer 119, such that the charge-trapping layer 119 can retain trapped electrons that alter the threshold voltage of the split gate flash memory cells 102a, 102b in a discrete manner that corresponds to different data states being stored in the split gate flash memory cells 102a, 102b.

Memory gate sidewall spacers 120a, 120b are arranged on outer edges of the ledges formed by upper surface of the charge-trapping dielectric structure 118a, 118b. In some embodiments, the memory gate sidewall spacers 120a, 120b comprise first, inner memory gate spacers 122 and second, outer memory gate spacers 124. The first memory gate spacers 122 are arranged on ledges of the first and second memory gates 112a, 112b and extend along outer sidewalls of the first and second memory gates 112a, 112b. The second memory gate spacers 124 are arranged on the charge-trapping dielectric structure 118a, 118b and extend along outer sidewalls of the first memory gate spacers 122.

Nitride-free or oxide spacers 126a, 126b are formed in sidewall recesses of the charge-trapping dielectric structure 118a, 118b, and can extend upwardly along an outer sidewall of the second memory gate spacers 124 over an outer edge of the channel regions 114a, 114b nearest the individual source regions 104a, 104b. The material of nitride-free or oxide spacers 126a, 126b can also be disposed along an inner sidewall of select gates 110a, 110b (see 128a, 128b), and can extend into a sidewall recess within SG dielectrics 116a, 116b. The nitride-free or oxide spacers 126a, 126b can each have an upper surface that is tapered to have a first height at the memory gate sidewall spacers 120a, 120b and a second, reduced height nearer the first and second individual source regions 104a, 104b.

Nitride sidewall spacers 130a, 130b, such as made of silicon nitride (e.g., Si3N4) or silicon oxynitride (SiOxNy), can extend along outer sidewalls of the nitride-free or oxide spacers 126a, 126b. An inter-layer dielectric (ILD) 132, such as silicon dioxide or a low-K dielectric material, is disposed over the structure, and contacts 134 extend downward through the ILD layer 132 to make contact with a silicide layer 136 on an upper region of the individual source regions 104a, 104b and common drain region 106.

By positioning the oxide spacer layer or the nitride-free spacer 126a, 126b over an edge portion of channel regions 114a, 114b; the spacers 126a, 126b "push" the nitride sidewall spacers 130a, 130b outwards, which limits undesirable charge-trapping due to the nitride sidewall spacers 130a, 130b. Thus, Vt degradation over a lifetime of the memory cells 102a, 102b is limited.

Figure 2:
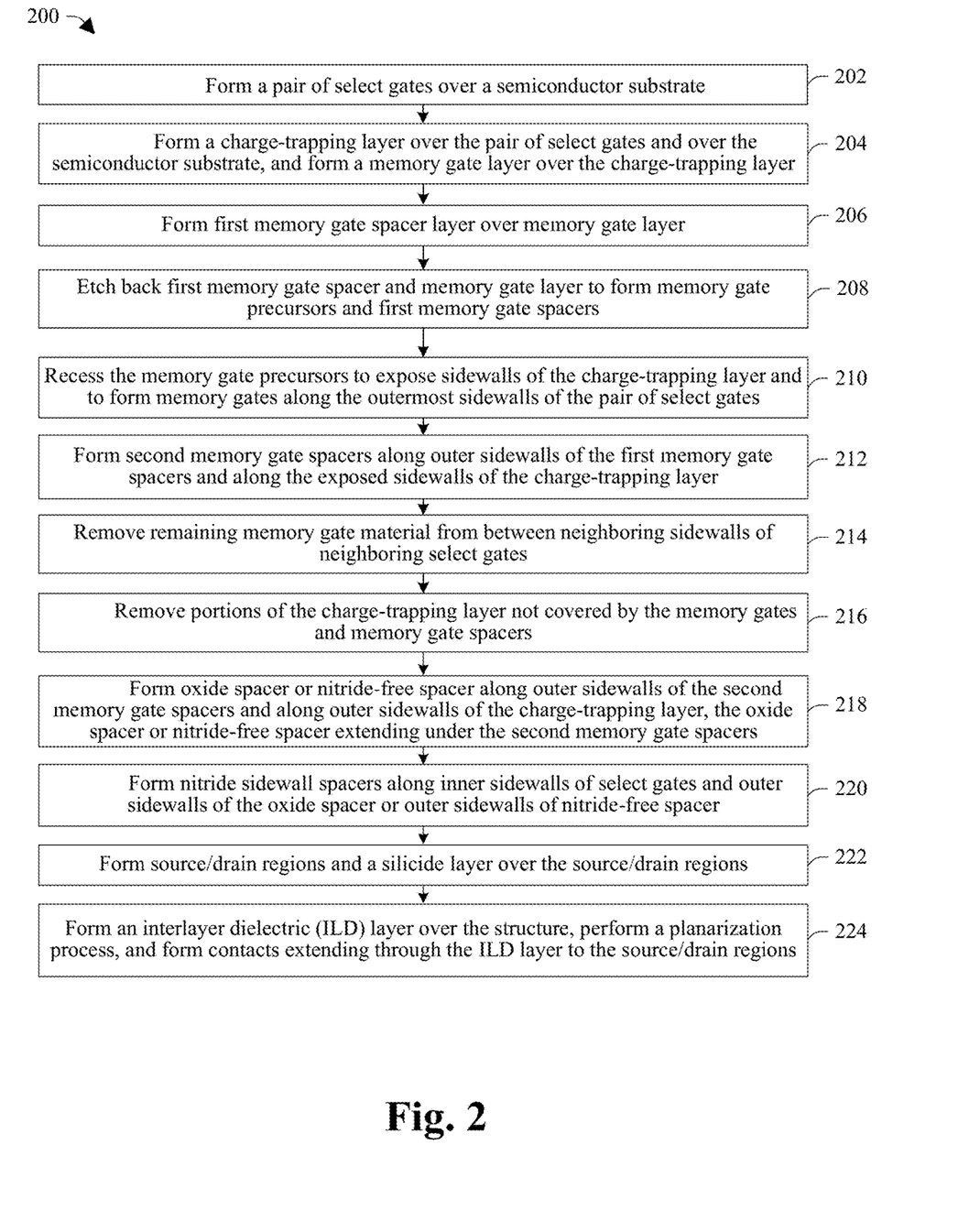
FIG. 2 illustrates a flow diagram of some embodiments of a method of forming split gate memory cells.

With reference to FIG. 2, a flowchart of some embodiments of a method 200 for manufacturing an integrated circuit is provided.

At 202, a pair of select gates are formed over a semiconductor substrate.

At 204, a charge-trapping layer is formed over the pair of select gates and over the semiconductor substrate. A memory gate layer is then formed over the charge-trapping layer.

At 206, a first memory gate spacer layer is conformally formed over the memory gate layer.

At 208, the first memory gate spacer layer and memory gate layer are etched back to establish memory gate precursors and first memory gate spacers. The memory gate precursors are formed along outer sidewalls of the pair of select gates and between neighboring sidewalls of the select gates. The first memory gate spacers are disposed along ledges in the memory gate precursors, wherein the ledges are on outer sidewalls of the memory gate precursors.

At 210, the memory gate precursors are recessed to expose sidewalls of the charge-trapping layer and to form memory gates along the outer sidewalls of the pair of select gates.

At 212, second memory gate spacers are formed along outer sidewalls of the first memory gate spacers and along the exposed sidewalls of the charge trapping layer.

At 214, the remaining memory gate material is removed from between neighboring sidewalls of the neighboring select gates.

At 216, portions of the charge-trapping layer that are not covered by the memory gates and memory gate spacers are removed.

At 218, an oxide spacer or nitride-free spacer is formed along outer sidewalls of the second memory gate spacers and along outer sidewalls of the charge-trapping layer. The oxide or nitride-free spacer extends under the second memory gate spacers.

At 220, nitride sidewall spacers are formed along inner sidewalls of the select gates and outer sidewalls of the oxide or nitride-free spacer.

At 222, an ion implantation operation is carried out to form source/drain regions. A silicide layer, such as a nickel silicide for example, is formed over the source/drain regions.

At 224, an ILD layer is formed over the structure. The structure is then planarized, and contacts are formed through the ILD layer to ohmically connect to the source/drain regions.

While the disclosed method 200 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

With reference to FIGS. 3-19, cross-sectional views of a method of forming a pair of split gate memory cells according to some embodiments are provided. Although FIGS. 3-19 are described in relation to method 200, it will be appreciated that the structures disclosed in FIGS. 3-19 are not limited to such a method.

Figure 3:
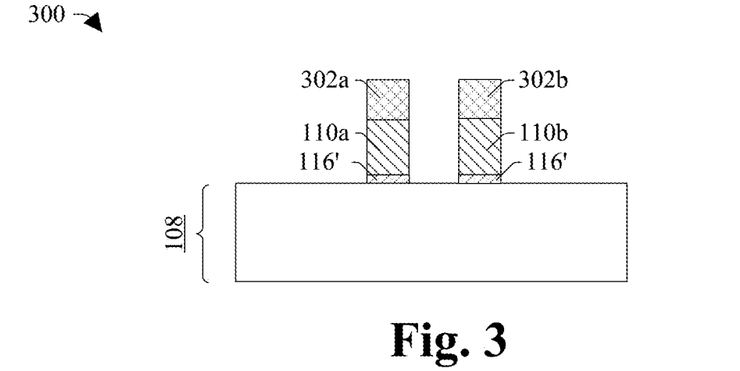
FIGS. 3-19 illustrate some embodiments of cross-sectional views at various stages of manufacture of a method of forming split gate flash memory cells.

FIG. 3 illustrates some embodiments of a cross-sectional view 300 corresponding to act 202.

As shown in cross-sectional view 300, a semiconductor substrate 108 is provided. A select gate dielectric layer 116' is formed on the semiconductor substrate 108, and a select gate layer is formed over the select gate dielectric layer 116'. A select gate (SG) hard mask 302a, 302b is then formed over the select gate layer, and an etch is carried out with the SG hard mask in place to form a pair of select gates 110a, 110b. In some embodiments, the SG hard mask 302a, 302b is formed by a lithographic process, wherein a layer of photoresist liquid is spun onto the select gate layer and the photoresist is selectively exposed to light through lithography. The exposed resist is then developed and can constitute the SG hard mask 302a, 302b, or can be used to pattern a nitride layer or another layer(s) to constitute the SG hard mask 302a, 302b.

The semiconductor substrate 108 can be n-type or p-type, and can, for example, be a silicon wafer, such as a Si bulk wafer or a silicon-on-insulator (SOI) wafer. If present, an SOI substrate comprises an active layer of high quality silicon, which is separated from a handle wafer by a buried oxide layer. The select gate dielectric layer 116' can be an oxide, such as silicon dioxide, or a high-κ dielectric material. The select gates 110a, 110b are made of a conductive material, such as doped polysilicon. The SG hard masks 302a, 302b often include nitrogen, and can be silicon nitride in some embodiments.

Figure 4:
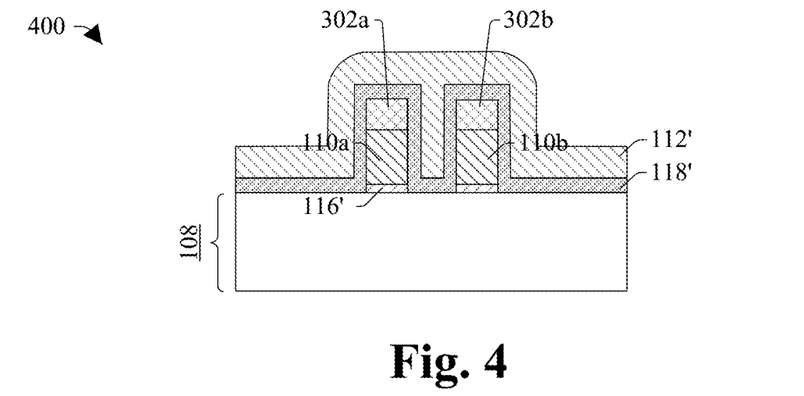

FIG. 4 illustrates some embodiments of a cross-sectional view 400 corresponding to act 204.

As shown in cross-sectional view 400, a charge-trapping layer 118' is formed over an upper surface of the SG hard masks 302a, 302b, along sidewalls of SG hard masks 302a, 302b; along sidewalls of select gates 110a, 110b; and along sidewalls of SG dielectric layer 116'. A memory gate (MG) layer 112' is then formed over the upper surfaces and sidewalls of the charge-trapping layer 118'.

In some embodiments, the charge-trapping layer 118' can be formed by plasma enhanced chemical vapor deposition (PECVD). In some embodiments, the charge-trapping layer 118' includes a charge-trapping silicon nitride layer sandwiched between two silicon dioxide layers to create a three-layer stack commonly referred to as an "ONO" layer. In other embodiments, the charge-trapping layer 118' may include a silicon-rich nitride film or a layer of silicon nanoparticle dots, or any film that includes, but is not limited to, silicon, oxygen, and nitrogen in various stoichiometries. In some embodiments, the MG layer 112' can be, for example, doped polysilicon or metal. The MG layer 112' can be formed by deposition techniques such as chemical vapor deposition (CVD) or physical vapor deposition (PVD), for example.

Figure 5:
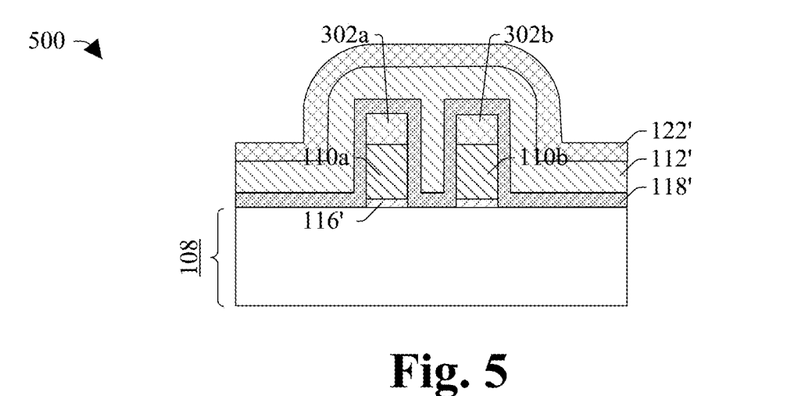

FIG. 5 illustrates some embodiments of a cross-sectional view 500 corresponding to act 206.

As shown in cross-sectional view 500, first memory gate spacer layer 122' is formed over the upper surfaces and sidewalls of the memory gate layer 112'. The first memory gate spacer layer 122' can be a conformal layer made of silicon nitride, for example. In some embodiments, the first memory gate spacer layer 122' can be formed by plasma enhanced chemical vapor deposition (PECVD), chemical vapor deposition (CVD) or physical vapor deposition (PVD).

Figure 6:
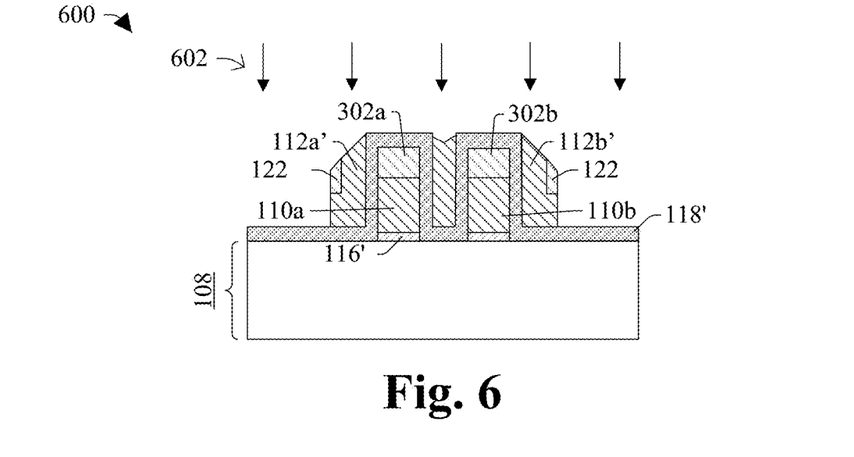

FIG. 6 illustrates some embodiments of a cross-sectional view 600 corresponding to act 208.

As shown in cross-sectional view 600, first MG spacers 122 are formed directly along sidewalls of the memory gate precursors 112a', 112b'. In some embodiments, the first memory gate spacers 122 are formed by carrying out an anisotropic etch 602 to etch the first memory gate spacer layer 122' and the memory gate layer 112' back to form first MG spacers 122 and memory gates precursors 112a', 112b'.

Figure 7:
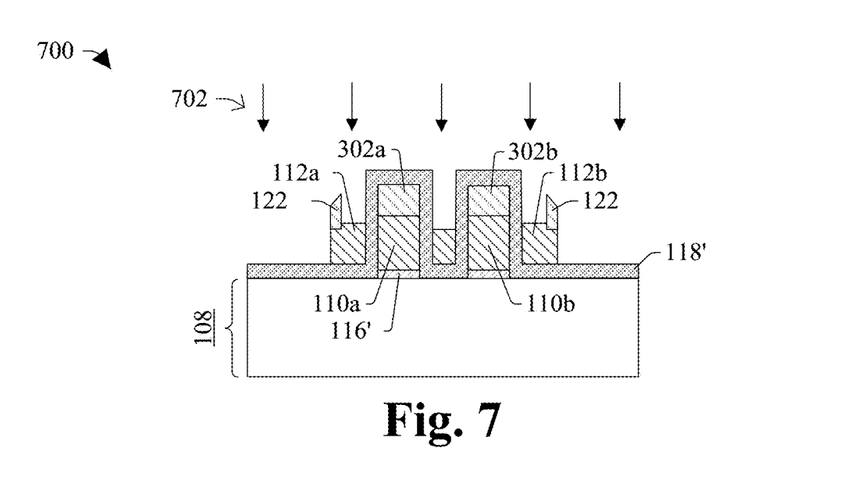

FIG. 7 illustrates some embodiments of a cross-sectional view 700 corresponding to act 210.

As shown in cross-sectional view 700, a second etch 702 is performed to recess the memory gate precursors 112a', 112b', thereby forming memory gates 112a, 112b. The first memory gate spacers 122 protect the upper corners of the memory gates 112a, 112b during second etch 702. In some embodiments, the second etch 702 may be performed using a dry etchant (e.g., an RIE etch, a plasma etch, etc.) or a wet etchant (e.g., hydrofluoric acid). The second etch 702 recesses the memory gate precursors to a height level substantially equal to that of the select gates 110a, 110b. An etchant used in the second etch 702 may be highly-selective to the charge-trapping layer 118', so as to not damage the charge-trapping layer 118'.

Figure 8:
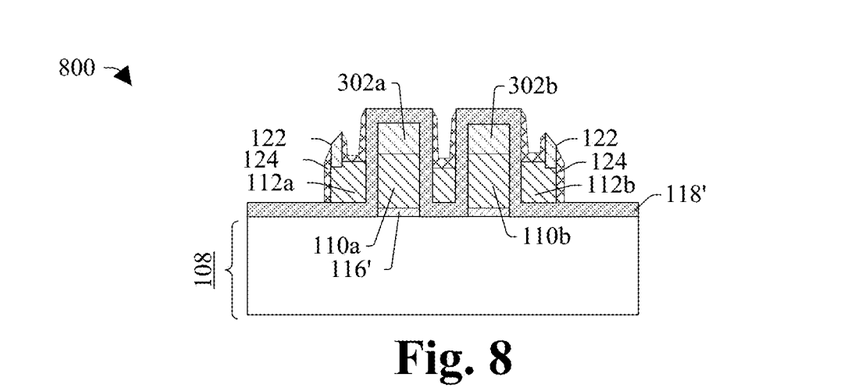

FIG. 8 illustrates some embodiments of a cross-sectional view 800 corresponding to act 212.

As shown in cross-sectional view 800, second MG spacers 124 are formed directly on outer sidewalls of the first memory gate spacers 122, and directly over the charge-trapping layer 118'. The second MG spacers 124 extend along outer sidewalls (of the first MG spacers 122. In some embodiments, the second memory gate spacers 124 are formed by depositing a nitride layer over the entire structure and performing an anisotropic etch to form second MG spacers 124. In some embodiments, the second MG spacers 124 comprise silicon nitride. The material of the MG spacers may also reside over memory gates 112a, 112b and on exposed sidewalls of charge-trapping dielectric layer 118'.

Figure 9:
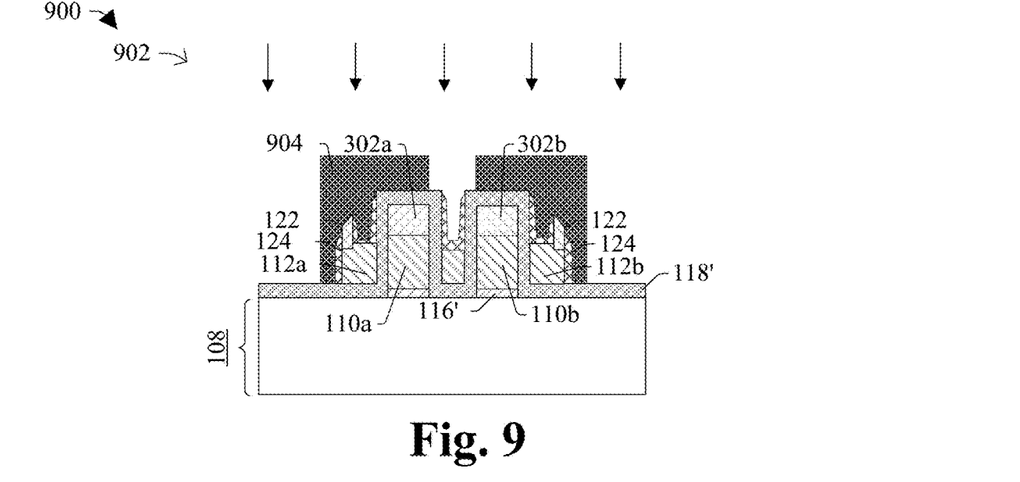
Figure 10:
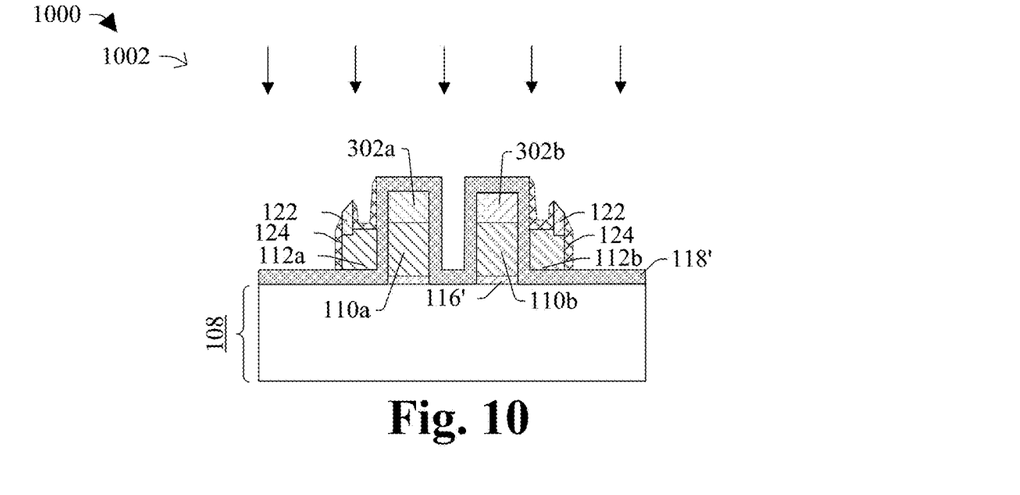

FIGS. 9-10 illustrate some embodiments of cross-sectional views 900, 1000 corresponding to act 214.

As shown in cross-sectional view 900 (FIG. 9), a mask 904 is patterned over the structure, and with the mask 904 in place, a third etch 902 is performed to remove the remaining MG material from between neighboring select gates 110a, 110b; resulting in the structure of FIG. 10. In various embodiments, the etchant used in the third etch 902 may be a dry etchant (e.g., an RIE etch, a plasma etch, etc.) or a wet etchant (e.g., hydrofluoric acid).

Figure 11:
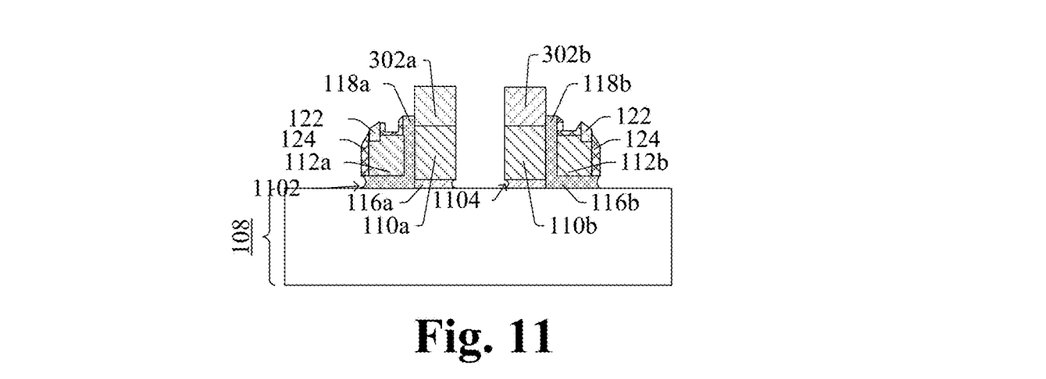

FIGS. 10-11 illustrate some embodiments of cross-sectional views 1000, 1100 corresponding to act 216.

As shown in cross-sectional view 1000 (FIG. 10), the mask 904 has been removed, and a fourth etch 1002 is then performed to remove exposed portions of the charge-trapping layer 118' (i.e., portions of the charge-trapping layer 118' not covered by the memory gates 112a, 112b and not covered by first and second MG spacers 122, 124). In some embodiments, the fourth etch 1002 may be performed using a dry etchant (e.g., an RIE etch, a plasma etch, etc.) or a wet etchant (e.g., hydrofluoric acid), thereby resulting in the structure of FIG. 11.

As can be seen from FIG. 11, the fourth etch 1002 may remove portions of the charge-trapping dielectric layer 118' to expose upper surface of the semiconductor substrate 108. The fourth etch 1002 may also form outer sidewall recesses 1102 in the charge trapping dielectric structure 118a, 118b. These outer sidewall recesses 1102 may have a rounded cross-sectional profile or a concave cross-sectional profile. In some embodiments, the fourth etch 1002 may also form inner sidewall recesses 1104 in the SG dielectric 116a, 116b. The amount of undercut by which these sidewall recesses undercut the overlying structures may vary widely. For example, in some embodiments, the outer sidewall recesses 1102 may have an innermost surface that terminates directly under the first MG spacers 122, but in other embodiments the outer sidewall recesses 1102 may have an innermost surface that terminates directly under the second MG spacers 124.

Figure 12:
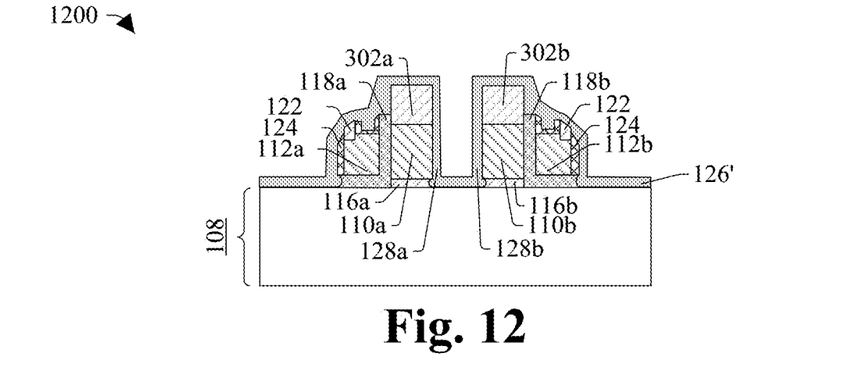

FIG. 12 illustrates some embodiments of a cross-sectional view 1200 corresponding to act 218.

As shown in FIG. 12, an oxide spacer layer or a nitride-free spacer layer 126' is formed over the structure. The oxide spacer layer or the nitride-free spacer layer 126' can be a conformal layer that fully or partially fills the inner and outer sidewall recesses 1102, 1104. In some embodiments, the oxide spacer layer is made of silicon dioxide and is formed by chemical vapor deposition (CVD), plasma vapor deposition (PVD), spin on techniques, or other suitable techniques. The nitride-free spacer layer is a dielectric layer that exhibits and absence of nitride.

Figure 13:
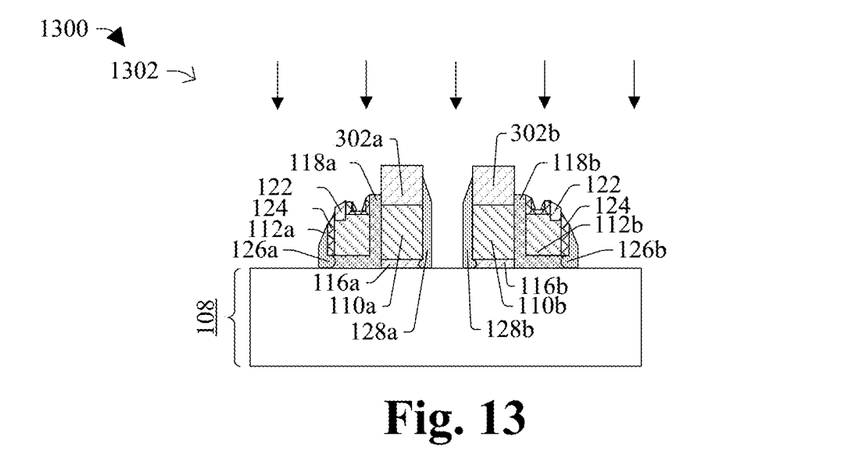

FIG. 13 illustrates some embodiments of a cross-sectional view 1300 corresponding to act 218.

As shown in FIG. 13, a fifth etch 1302 is carried out to the form an oxide spacer or nitride-free spacer 126a, 126b along outer sidewalls of the second MG spacers 124. The fifth etch may also leave oxide spacers or nitride-free spacers 128a, 128b on inner sidewall of select gates 110a, 110b. In some embodiments, the fifth etch 1302 is an anisotropic etch, such as a highly vertical plasma etch.

Figure 14:
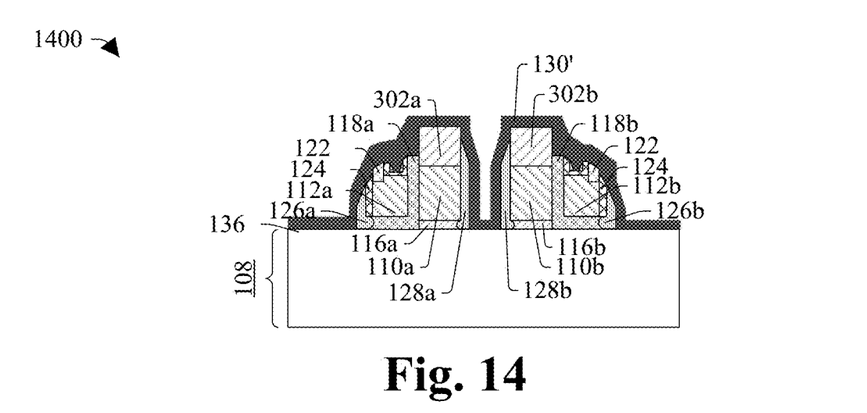

FIG. 14 illustrates some embodiments of a cross-sectional view 1400 corresponding to act 220.

As shown in cross-sectional view 1400, a nitride spacer material 130' is formed over the structure. In some embodiments, the sidewall spacer material 130' can be silicon nitride. In some embodiments, the nitride spacer material 130' is formed concurrently with a sidewall spacer formed along sidewalls of a gate electrode on a logic region of the semiconductor substrate 108. The logic region can be separate from a memory region where the split gate memory device are formed.

Figure 15:
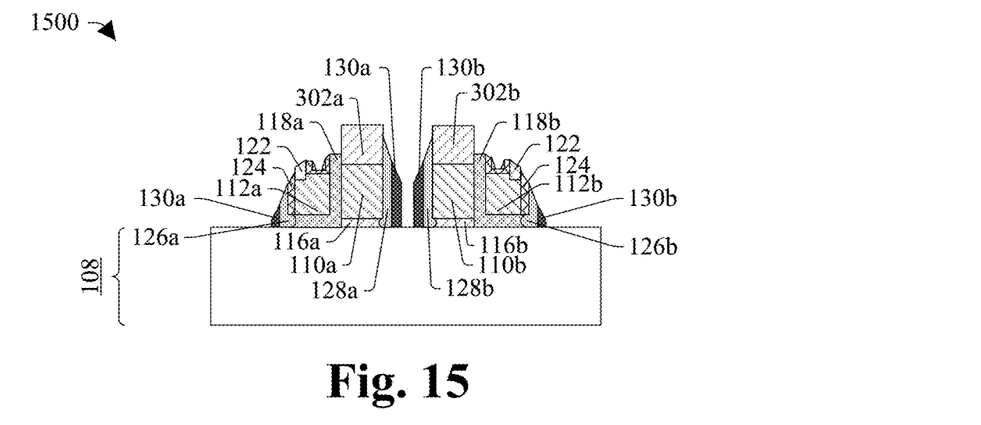

FIG. 15 illustrates some embodiments of a cross-sectional view 1500 corresponding to act 220.

As shown in cross-sectional view 1500, the nitride spacer material 130' is etched to form nitride sidewall spacers 130a, 130b extending along outer sidewalls of the oxide spacer layer or the nitride-free spacer layer 126. By positioning the oxide spacers or the nitride-free spacers 126a, 126b over the channel region between source/drain regions, the spacers 126a, 126b "push" the nitride sidewall spacer 130a, 130b outwards; thereby limiting undesirable charge-trapping in the final device.

Figure 16:
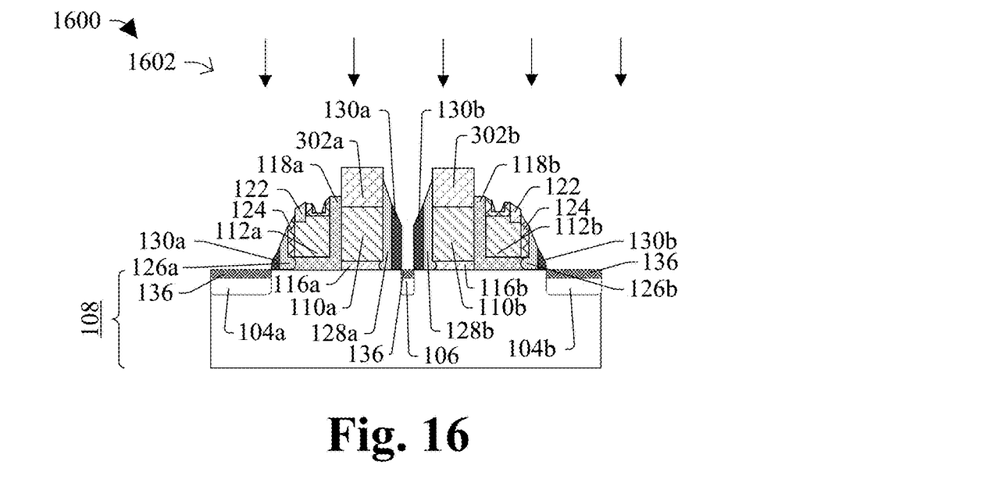

FIG. 16 illustrates some embodiments of a cross-sectional view 1600 corresponding to act 222.

As shown in cross-sectional view 1600, an ion implantation 1602 is carried out to form individual source regions 104a, 104b, and common drain region 106 in the semiconductor substrate 108. A silicide layer 136 is formed over the individual source regions 104a, 104b, and common drain region 106 to facilitate ohmic connection to the individual source regions and common drain region. Alternatively, rather than ion implantation, individual source regions 104a, 104b, and common drain region 106 can be formed by forming a heavily doped layer over the structure, and dopants can be out-diffused from the heavily doped layer into the substrate to form individual source regions 104a, 104b, and common drain region 106. In some embodiments, the individual source regions 104a, 104b and common drain region 106 are self-aligned to edges of the nitride spacers 130a, 130b or nitride-free or oxide spacers 126, 128.

Figure 17:
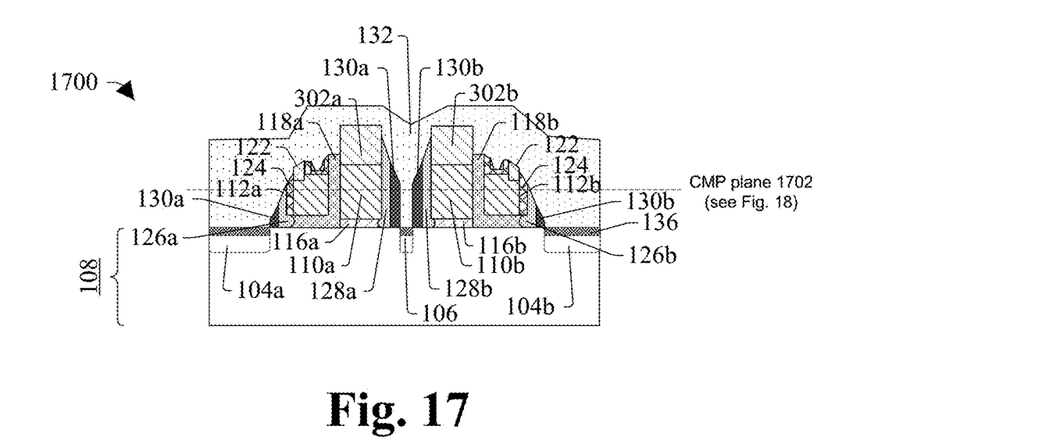

FIG. 17 illustrates some embodiments of a cross-sectional view 1700 corresponding to act 224.

As shown in cross-sectional view 1700, an interlayer dielectric (ILD) layer 132, for example a low-K material, is formed to fill spaces over the silicide layer 136 and cover the workpiece. A planarization process is also carried out on the structure of FIG. 17 to reach CMP plane 1702, as shown in FIGS. 17-18.

Figure 18:
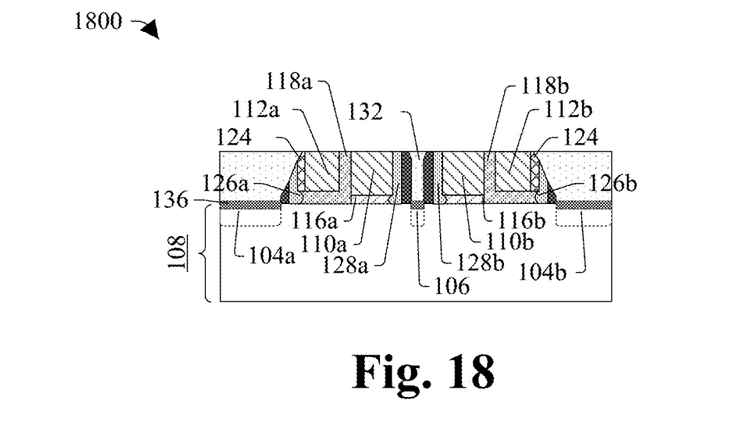

FIG. 18 illustrates some embodiments of a cross-sectional view 1800 corresponding to act 224.

As shown in FIG. 18, a planarization process is performed to form select gates 110a, 110b; memory gates 112a, 112b; charge-trapping dielectric structure 118a, 118b; first memory gate spacers 122; and second memory gate spacers 124. These structures have upper surfaces planarized along a horizontal plane 1702. See also FIG. 17, which illustrates the horizontal plane 1702 prior to planarization being carried out. It is duly noted that the spacing of the horizontal plane 1702 over the upper surface of semiconductor substrate 108 can vary widely depending on the implementation. For example, in some other embodiments, the horizontal plane 1702 at which planarization is completed can be higher than illustrated, leaving some or all portions of the SG hard masks 302a, 302b in place in the final manufactured structure. In other embodiments, however, the horizontal plane 1702 can be lower than illustrated, removing larger portions of the illustrated structures—for example, possibly removing upper portions of spacers 126a, 126b to leave spacers 126a, 126b with a planar upper surface.

Figure 19:
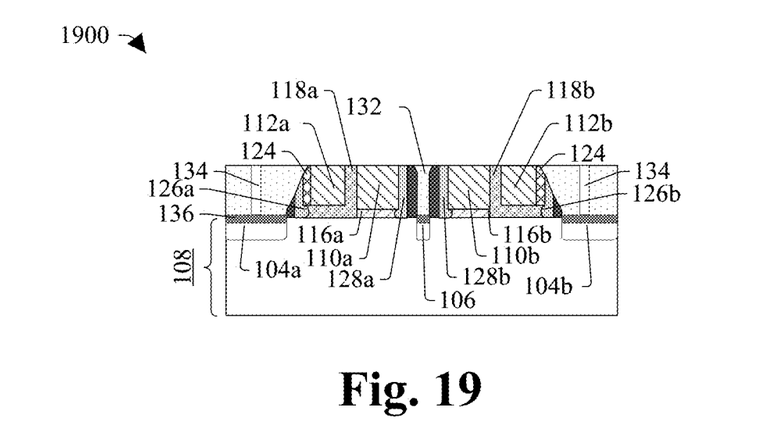

FIG. 19 illustrates some embodiments of a cross-sectional view 1900 corresponding to act 224.

As shown in cross-sectional view 1900, contacts 134 are formed through the ILD layer 132, extending to the individual source regions 104a, 104b and common drain region 106. In some embodiments, the contacts 134 comprise a metal, such as copper, gold, or tungsten. In some embodiments, the contacts 134 are formed by performing a patterned etch to create openings in the ILD layer 132, followed by filling the openings with a metal.

Thus, the present disclosure relates to an integrated circuit that includes a split gate flash memory cell. In some embodiments, the integrated circuit includes a semiconductor substrate having first and second source/drain regions which are separated from one another by a channel region. The channel region includes a first portion adjacent to the first source/drain region and a second portion adjacent the second source/drain region. A select gate is spaced over the first portion of the channel region and is separated from the first portion of the channel region by a select gate dielectric. A memory gate is spaced over the second portion of the channel region and is separated from the second portion of the channel region by a charge-trapping dielectric structure. The charge-trapping dielectric structure extends upwardly alongside the memory gate to separate neighboring sidewalls of the select gate and memory gate from one another. An oxide spacer or nitride-free spacer is arranged in a sidewall recess of the charge-trapping dielectric structure nearest the second source/drain region.

In other embodiments, the present disclosure relates to an integrated circuit including a pair of split gate flash memory cells. The integrated circuit includes a semiconductor substrate having a common source source/drain region and first and second individual source/drain regions which are separated from the common source/drain region by first and second channel regions, respectively. First and second select gates are spaced over the first and second channel regions, respectively, and are separated from the first and second channel regions by first and second select gate dielectrics, respectively. First and second memory gates are spaced over the first and second channel regions, respectively, and are separated from the semiconductor substrate by a charge-trapping dielectric structure. The charge-trapping dielectric structure extends upwardly along outer sidewalls of the first and second select gates to separate the outer sidewalls of the select gates from inner sidewalls of the memory gates. An oxide spacer or nitride-free spacer is arranged in a sidewall recess of the charge-trapping dielectric structure nearest the first or second individual source/drain region.

In yet another embodiment, the present disclosure relates to a method of forming a split gate memory device. In this method, a pair of select gates is formed over a semiconductor substrate. A charge-trapping layer is formed over the semiconductor substrate and along outer sidewalls of the select gates. Memory gates are formed over the charge-trapping layer. The memory gates are adjacent to the outer sidewalls of the pair of select gates and are separated from the outer sidewalls of the pair of select gates by the charge-trapping layer. Memory gate spacers are formed along outer sidewalls of the memory gates. Portions of the charge-trapping layer not covered by the memory gates and the memory gate spacers are removed to leave sidewall recesses in the charge-trapping layer under outer sidewalls of the memory gate spacers. An oxide spacer or nitride-free spacer is then formed along outer sidewalls of the memory gate spacers. The oxide spacer or nitride-free spacer extends into the sidewall recess in the charge-trapping layer.

It will be appreciated that in this written description, as well as in the claims below, the terms "first", "second", "second", "third" etc. are merely generic identifiers used for ease of description to distinguish between different elements of a figure or a series of figures. In and of themselves, these terms do not imply any temporal ordering or structural proximity for these elements, and are not intended to be descriptive of corresponding elements in different illustrated embodiments and/or un-illustrated embodiments. For example, "a first dielectric layer" described in connection with a first figure may not necessarily correspond to a "first dielectric layer" described in connection with a second figure (e.g., and may even correspond to a "second dielectric layer" in the second figure), and may not necessarily correspond to a "first dielectric layer" in an un-illustrated embodiment.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit including a split gate flash memory cell, comprising:
   a semiconductor substrate including first and second source/drain regions which are separated from one another by a channel region;
   a gate electrode spaced over the channel region and separated from the channel region by a charge-trapping dielectric structure, wherein the charge-trapping dielectric structure extends laterally past a sidewall of the gate electrode to establish a ledge, and wherein a sidewall recess in the charge-trapping dielectric structure undercuts the ledge;
   a first spacer arranged in the sidewall recess of the charge-trapping dielectric structure directly over the channel region; and
   a second spacer disposed on the ledge and extending upwardly alongside a sidewall of the gate electrode to separate the sidewall of the gate electrode from the first spacer.

2. The integrated circuit of claim 1, wherein the first spacer is a nitride-free spacer or an oxide spacer.

3. The integrated circuit of claim 1, wherein the first spacer has a first composition that differs from a second composition of the second spacer.

4. The integrated circuit of claim 1, wherein the second spacer comprises a first, inner sidewall spacer arranged on an upper surface of the gate electrode and a second outer sidewall spacer arranged on the ledge and contacting the first, inner sidewall spacer.

5. The integrated circuit of claim 1, wherein the first spacer is nearer the first source/drain region than the second source/drain region and extends upwardly along an outer sidewall of the second spacer, where the first spacer has an upper surface that is tapered to have a first height at the second spacer and a second, reduced height nearer the first source/drain region.

6. The integrated circuit of claim 5, further comprising:
a third spacer disposed along an outer sidewall of the first spacer, the third spacer being disposed between the first spacer and the first source/drain region.

7. The integrated circuit of claim 6, where the third spacer has an upper surface that is tapered to have the second, reduced height where the third spacer contacts the outer sidewall of the first spacer, and has a third height less than the second, reduced height on an outer sidewall of the third spacer nearer the first source/drain region.

8. The integrated circuit of claim 1, wherein the channel region includes a first portion adjacent to the first source/drain region and a second portion adjacent the second source/drain region, and wherein the gate electrode is a memory gate spaced over the second portion of the channel region, and further comprising:
a select gate spaced over the first portion of the channel region and separated from the first portion of the channel region by a select gate dielectric.

9. The integrated circuit of claim 8, wherein the charge-trapping dielectric structure extends upwardly alongside an inner sidewall of the memory gate to separate neighboring sidewalls of the select gate and memory gate from one another, and extends laterally past an outer sidewall of the memory gate to establish the ledge.

10. The integrated circuit of claim 1, wherein the charge-trapping dielectric structure comprises a nitride layer sandwiched between first and second dielectric layers, or wherein the charge-trapping dielectric structure comprises a layer of sphere-like silicon dots sandwiched between first and second dielectric layers.

11. An integrated circuit including a pair of split gate flash memory cells, comprising:
a semiconductor substrate including a common source/drain region and first and second individual source/drain regions which are separated from the common source/drain region by first and second channel regions, respectively;
first and second gate electrodes spaced over the first and second channel regions, respectively, and separated from the first and second channel regions by first and second gate dielectrics, respectively; and
a pair of first inner spacers arranged proximate to the common source/drain region in inner sidewall recesses of the first and second gate dielectrics.

12. The integrated circuit of claim 11, wherein the first and second gate electrodes are first and second select gates, respectively, and further comprising:
first and second memory gates spaced over the first and second channel regions, respectively, and separated from the semiconductor substrate by a charge-trapping dielectric structure, wherein the charge-trapping dielectric structure extends upwardly along outer sidewalls of the first and second select gates to separate the outer sidewalls of the first and second select gates from inner sidewalls of the first and second memory gates and extends laterally past a sidewall of the first memory gate to establish a ledge.

13. The integrated circuit of claim 12, wherein the charge-trapping dielectric structure extends laterally past first and second outer sidewalls of the first and second memory gates, respectively, to establish first and second ledges, respectively; and further comprising:
first and second memory gate sidewall spacers disposed on the first and second ledges, respectively, and extending upwardly alongside the first and second outer sidewalls of the first and second memory gates, respectively.

14. The integrated circuit of claim 11, further comprising:
a pair of second inner spacers arranged along inner sidewalls the pair of first inner spacers, respectively; and
a contact extending downward between inner sidewalls of the second pair of inner spacers to contact the common source/drain region.

15. The integrated circuit of claim 13, wherein the first and second memory gate sidewall spacers have different heights from the pair of first inner spacers arranged in the inner sidewall recesses of the first and second gate dielectrics.

16. The integrated circuit of claim 14, wherein the first and second memory gate sidewall spacers have different heights from the pair of second inner spacers arranged along the inner sidewalls the pair of first inner spacers, respectively.

17. An integrated circuit including a split gate flash memory cell, comprising:
a semiconductor substrate including first and second source/drain regions which are separated from one another by a channel region;
a gate electrode spaced over the channel region and separated from the channel region by a charge-trapping dielectric structure, the charge-trapping dielectric structure including an upper dielectric layer and a lower dielectric layer that are separated from one another by a charge-trapping layer, wherein the upper dielectric layer extends laterally past an outer sidewall of the gate electrode to establish a ledge and wherein an outer sidewall recess undercuts the ledge;
a first spacer disposed on the ledge and extending upwardly alongside an outer sidewall of the gate electrode; and
a second spacer arranged in the outer sidewall recess of the charge-trapping dielectric structure, wherein the first spacer separates the outer sidewall of the gate electrode from the first second spacer.

18. The integrated circuit of claim 17, wherein the first spacer comprises a first, inner sidewall spacer arranged on an upper surface of the gate electrode and a second outer sidewall spacer arranged on the ledge and contacting the first, inner sidewall spacer.

19. The integrated circuit of claim 17, wherein the channel region includes a first portion adjacent to the first source/drain region and a second portion adjacent the second source/drain region, and wherein the gate electrode is a memory gate spaced over the second portion of the channel region, and further comprising:
a select gate spaced over the first portion of the channel region and separated from the first portion of the channel region by a select gate dielectric.

20. The integrated circuit of claim 19, wherein the charge-trapping dielectric structure extends upwardly alongside an inner sidewall of the memory gate to separate neighboring sidewalls of the select gate and memory gate from one another, and extends laterally past an outer sidewall of the memory gate to establish the ledge.

* * * * *